United States Patent
Tinnemans et al.

(10) Patent No.: US 12,032,299 B2
(45) Date of Patent: Jul. 9, 2024

(54) METROLOGY METHOD AND ASSOCIATED METROLOGY AND LITHOGRAPHIC APPARATUSES

(71) Applicants: ASML NETHERLANDS B.V., Veldhoven (NL); ASML HOLDING N.V., Veldhoven (NL)

(72) Inventors: Patricius Aloysius Jacobus Tinnemans, Hapert (NL); Igor Matheus Petronella Aarts, Port Chester, NY (US); Kaustuve Bhattacharyya, Veldhoven (NL); Ralph Brinkhof, Vught (NL); Leendert Jan Karssemeijer, s Hertogenbosch (NL); Stefan Carolus Jacobus Antonius Keij, Breda (NL); Haico Victor Kok, Veldhoven (NL); Simon Gijsbert Josephus Mathijssen, Rosmalen (NL); Henricus Johannes Lambertus Megens, Waalre (NL); Samee Ur Rehman, Milpitas, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 72 days.

(21) Appl. No.: 17/784,566

(22) PCT Filed: Dec. 3, 2020

(86) PCT No.: PCT/EP2020/084387
§ 371 (c)(1),
(2) Date: Jun. 10, 2022

(87) PCT Pub. No.: WO2021/122016
PCT Pub. Date: Jun. 24, 2021

(65) Prior Publication Data
US 2023/0017491 A1    Jan. 19, 2023

(30) Foreign Application Priority Data

Dec. 16, 2019   (EP) .................................... 19216683

(51) Int. Cl.
G03F 7/00    (2006.01)
G03F 9/00    (2006.01)

(52) U.S. Cl.
CPC .... *G03F 7/70633* (2013.01); *G03F 7/706837* (2023.05); *G03F 9/7034* (2013.01); *G03F 9/7092* (2013.01)

(58) Field of Classification Search
CPC ......... G03F 7/706835; G03F 7/706837; G03F 7/706839; G03F 9/7046; G03F 9/7049; G03F 9/7092; G03F 7/70616
See application file for complete search history.

(56) References Cited

U.S. PATENT DOCUMENTS

| | | | |
|---|---|---|---|
| 6,961,116 B2 | 11/2005 | Den Boef et al. | |
| 2006/0033921 A1 | 2/2006 | Den Boef et al. | |

(Continued)

FOREIGN PATENT DOCUMENTS

| | | |
|---|---|---|
| EP | 3480554 | 5/2019 |
| NL | 2024472 | 12/2019 |

(Continued)

OTHER PUBLICATIONS

VR International Search Report and Written Opinion issued in corresponding PCT Patent Application No. PCT/EP2020/084387, dated Apr. 9, 2021.

(Continued)

*Primary Examiner* — Steven Whitesell Gordon
(74) *Attorney, Agent, or Firm* — Pillsbury Winthrop Shaw Pittman, LLP

(57) ABSTRACT

A metrology method relating to measurement of a structure on a substrate, the structure being subject to one or more (Continued)

asymmetric deviation. The method includes obtaining at least one intensity asymmetry value relating to the one or more asymmetric deviations, wherein the at least one intensity asymmetry value includes a metric related to a difference or imbalance between the respective intensities or amplitudes of at least two diffraction orders of radiation diffracted by the structure; determining at least one phase offset value corresponding to the one or more asymmetric deviations based on the at least one intensity asymmetry value; and determining one or more measurement corrections for the one or more asymmetric deviations from the at least one phase offset value.

25 Claims, 5 Drawing Sheets

(56) References Cited

U.S. PATENT DOCUMENTS

| | | | |
|---|---|---|---|
| 2006/0066855 | A1 | 3/2006 | Den Boef et al. |
| 2009/0195768 | A1 | 8/2009 | Bijnen et al. |
| 2010/0201963 | A1 | 8/2010 | Cramer et al. |
| 2011/0027704 | A1 | 2/2011 | Cramer et al. |
| 2011/0043791 | A1 | 2/2011 | Smilde et al. |
| 2011/0102753 | A1 | 5/2011 | Van De Kerkhof et al. |
| 2012/0044470 | A1 | 2/2012 | Smilde et al. |
| 2012/0123581 | A1 | 5/2012 | Smilde et al. |
| 2013/0258310 | A1 | 10/2013 | Smilde et al. |
| 2013/0271740 | A1 | 10/2013 | Quintanilha |
| 2015/0261097 | A1 | 9/2015 | Mathijssen et al. |
| 2015/0355554 | A1 | 12/2015 | Mathijssen |
| 2016/0313654 | A1* | 10/2016 | Zeng .................. G01B 11/272 |
| 2018/0203367 | A1* | 7/2018 | Jak .................. G01N 21/956 |
| 2018/0216930 | A1 | 8/2018 | Ur-Rehman |
| 2019/0094721 | A1 | 3/2019 | Tinnemans et al. |
| 2019/0107781 | A1 | 4/2019 | Stichting et al. |
| 2020/0089135 | A1 | 3/2020 | Goorden et al. |

FOREIGN PATENT DOCUMENTS

| | | |
|---|---|---|
| WO | 2009078708 | 6/2009 |
| WO | 2009106279 | 9/2009 |
| WO | 2013178422 | 12/2013 |
| WO | 2015051970 | 4/2015 |
| WO | 2016169901 | 10/2016 |
| WO | 2017032534 | 3/2017 |
| WO | 2017060054 | 4/2017 |
| WO | 2019001871 | 1/2019 |
| WO | 2019206586 | 10/2019 |
| WO | 2020057900 | 3/2020 |

OTHER PUBLICATIONS

Bechhoefer, J.: "Kramers-Kronig, Bode, and the meaning of zero", American Journal of Physics 79, 1053 (2011).
Bhattacharyya, K. et al.: "A study of swing-curve physics in diffraction-based overlay", Proc. of SPIE, vol. 97781 (2016).
Lucas, J. et al.: "A fast Fourier transform implementation of the Kramers-Kronig relations: application to anomalous and left handed propagation", AIP Advances 2, 032144 (2012).
Du, J. et al.: "Calibration method of overlay measurement error caused by asymmetric mark", Applied Optics, Research Article, 9814, vol. 57, No. 33 (Nov. 20, 2018).
Menchtchikov, B. et al.: "Reduction in overlay error from mark asymmetry using simulation ORION, and alignment models", Proc. of SPIE, vol. 10587 (2018).
Mecozzi, A. et al.: "Kramers-Kronig coherent receiver", Optica, vol. 3, No. 11 (2016).
Palmer, K.F. et al.: "Multiply subtractive Kramers-Kronig analysis of optical data", Applied Optics, vol. 37, No. 13 (1998).
Baek, Y.S., et al.: "Kramers-Kronig holographic imagine for high-space-bandwidth product", Optica, vol. 6, No. 1 (Jan. 2019).
Peiponen, K.E. et al.: Dispersion, Complex Analysis and Optical Spectroscopy, Springer Science & Business Media vol. 147 (1999).
Nussenzveig: "Causality and Dispersion Relations", Chapter I, Academic Press (1972).
Kronig, R. De L.: "On the Theory of Dispersion of X-Rays", Journal of the Optical Society of America and Review of Scientific Instruments, vol. 12, No. 6 (1926).
Kramers, M.H.A.: "La diffusion de la Luiniere par les atomes," Atti Congr. Intern. Fisici, Como, vol. 2, p. 545-557 (1927).
Plemelj, Von J.: "Riemannsche Funktionenscharen mit gegebener Monodromiegruppe," Monatshefte für Mathematik und Physik, vol. 19, pp. 211-246 (1908).

* cited by examiner

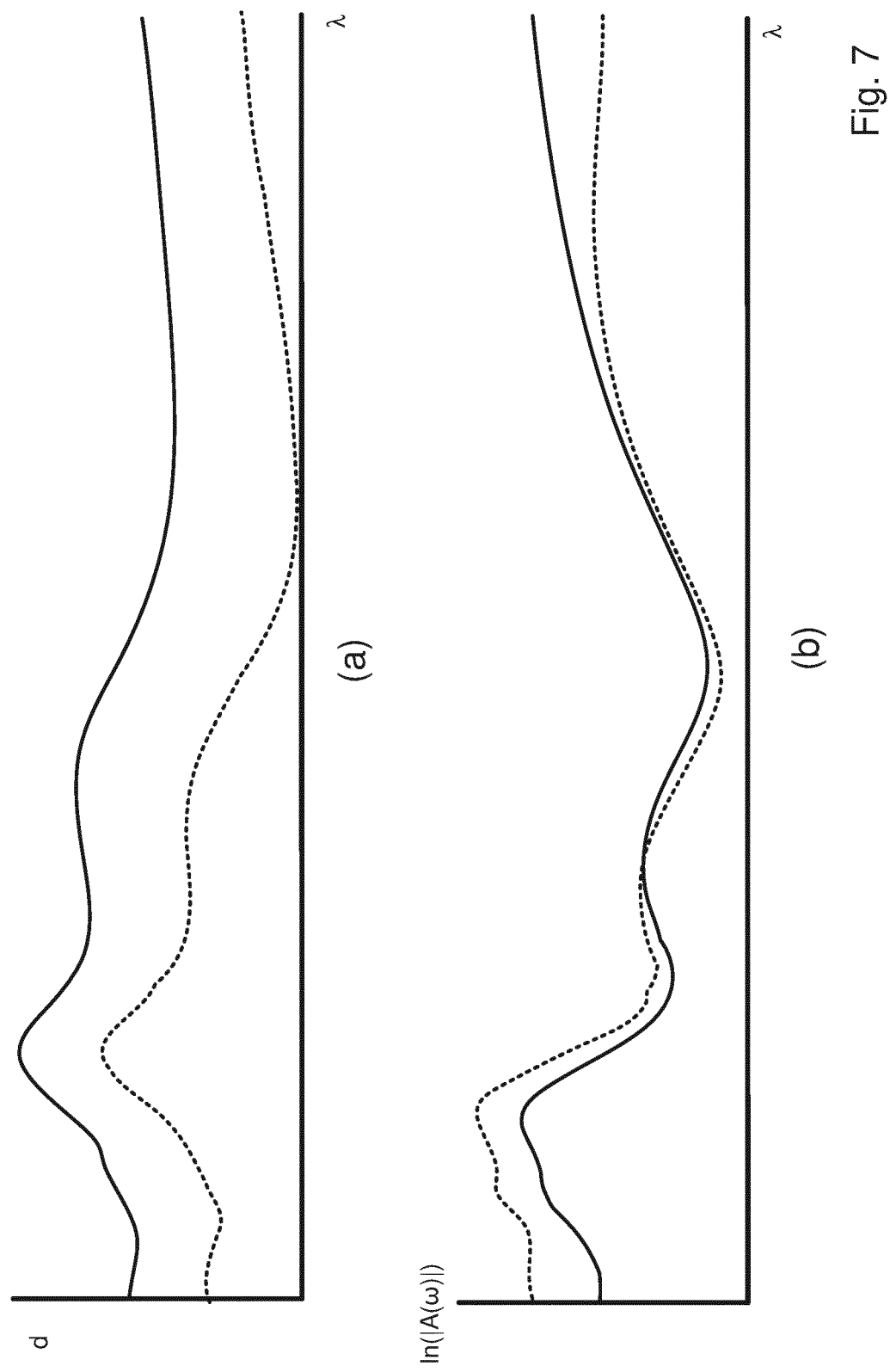

METROLOGY METHOD AND ASSOCIATED METROLOGY AND LITHOGRAPHIC APPARATUSES

CROSS-REFERENCE TO RELATED APPLICATION

The application is the U.S. national phase entry of PCT Patent Application No. PCT/EP2020/084387 which was filed on Dec. 3, 2020, which claims the benefit of priority of European Patent Application No. EP application 19216683.3 which was filed on Dec. 16, 2019, and which is incorporated herein in its entirety by reference.

FIELD OF THE INVENTION

The present invention relates to methods and apparatus usable, for example, in the manufacture of devices by lithographic techniques, and to methods of manufacturing devices using lithographic techniques. The invention relates more particularly to metrology sensors and lithography apparatuses having such a metrology sensor.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In some metrology applications, such as in some scatterometers or alignment sensors, imperfections in metrology targets can result in a wavelength/polarization dependent variation in a measured value from that target. As such, correction and/or mitigation for this variation is sometimes effected by performing the same measurement using multiple different wavelengths and/or polarizations (or more generally, multiple different illumination conditions). It would be desirable to improve one or more aspects of measuring using multiple illumination conditions.

SUMMARY OF THE INVENTION

The invention in a first aspect provides a metrology method relating to measurement of a structure on a substrate, said structure being subject to one or more asymmetric deviation, the method comprising: obtaining at least one intensity asymmetry value relating to the asymmetric deviation, wherein the at least one intensity asymmetry value comprises a metric related to a difference or imbalance between the respective intensities or amplitudes of at least two diffraction orders of radiation diffracted by said structure; determining at least one phase offset value corresponding to the one or more asymmetric deviation based on said at least one intensity asymmetry value; and determining one or more measurement correction for said one or more asymmetric deviation from the one or more phase offset.

Also disclosed is a computer program, alignment sensor and a lithographic apparatus being operable to perform the method of the first aspect.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which:

FIG. 7 comprise swing curves of (a) position and (b) intensity asymmetry against wavelengths for calculated and measured data.

DETAILED DESCRIPTION OF EMBODIMENTS

Before describing embodiments of the invention in detail, it is instructive to present an example environment in which embodiments of the present invention may be implemented.

Figure 1:
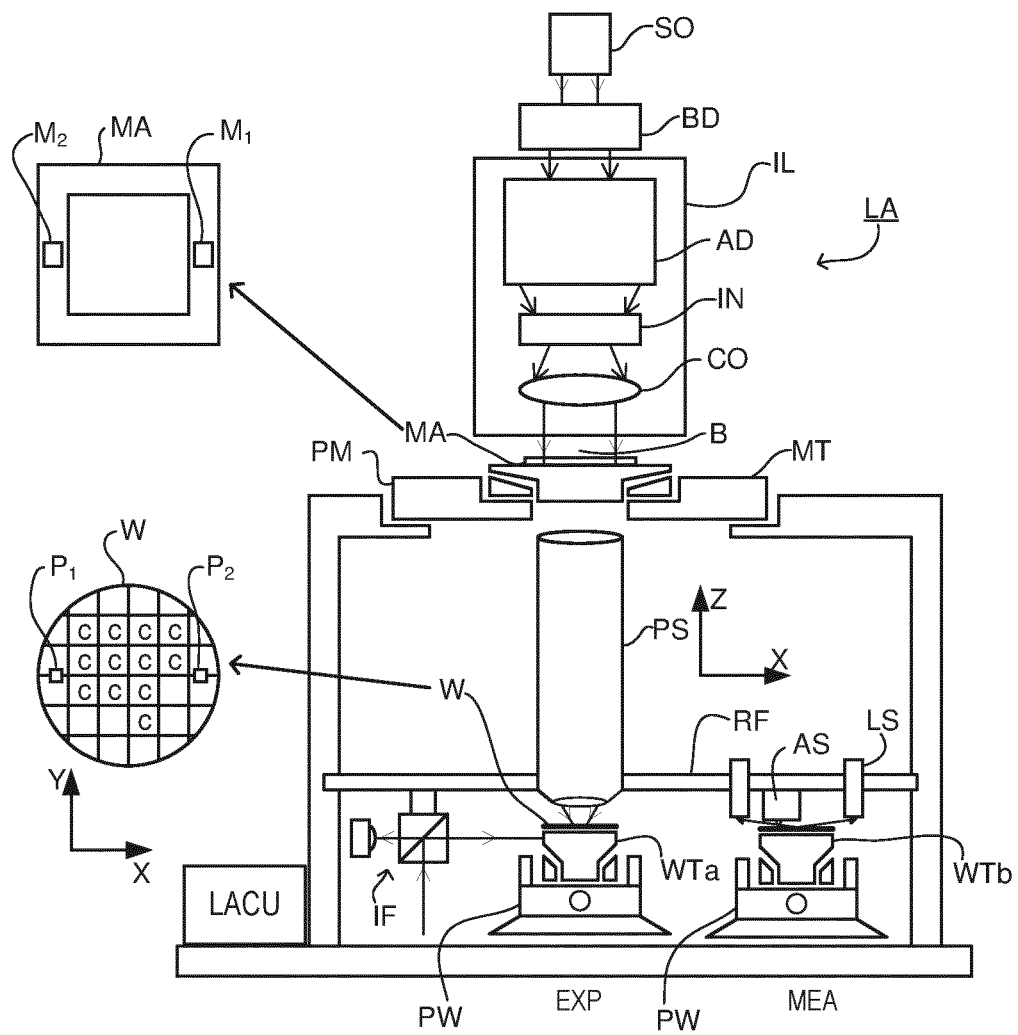
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
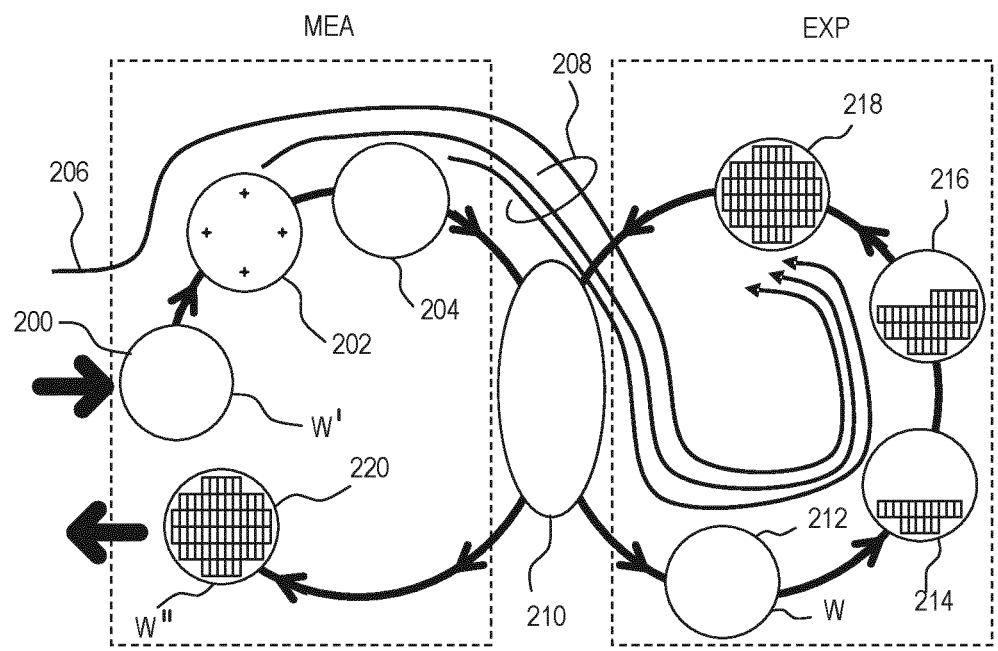
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data.

These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
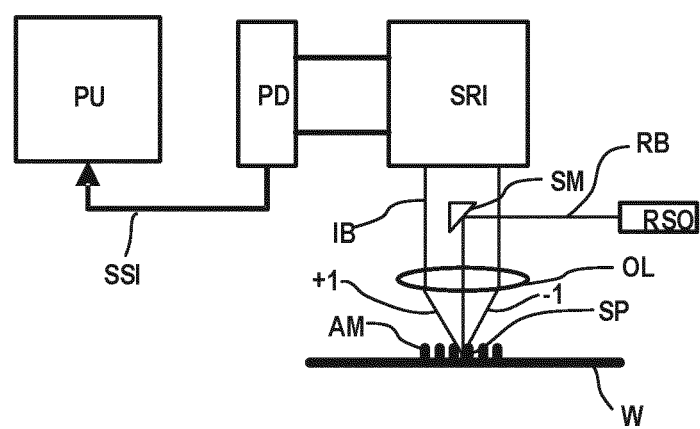
FIG. 3 is a schematic illustration of an alignment sensor adaptable according to an embodiment of the invention.

FIG. 3 is a schematic block diagram of an embodiment of a known alignment sensor AS. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include complementary higher diffracted orders; e.g.,: +1 and −1 diffracted orders (labelled +1, −1) and optionally zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

SRI Intensity signals SSI are supplied to a processing unit PU. By a combination of optical processing in the self-referencing interferometer SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided. Improvements in performing and processing such multiple wavelength measurements are disclosed below.

In the context of wafer alignment, the following approaches are in use or have been proposed to correct the mark position for mark asymmetry (asymmetry in the alignment mark which results in a position error or offset): OCW (Optimal Color Weighing—described in more detail in US publication US2019/0094721 A1 which is incorporated herein by reference), OCIW (Optimal Color and Intensity Weighing—described in more detail in PCT publication WO 2017032534 A2) and WAMM (Wafer Alignment Model Mapping—described in more detail in PCT publications WO 2019001871 A1 and WO 2017060054 A1). In each of these cases, training to reference data is needed or desired. This means that these corrections can only be accurately performed if sufficient training data is available and if the process variations in the training data are representative for the variations in the wafers that need to be corrected. This reference data may be measured by a reference sensor, e.g. hindsight overlay data.

To address this, it is proposed to use a dispersion model(s) and/or dispersion equation(s) and/or dispersion approximation(s), such as the Forouhi-Bloomer dispersion equation(s)/approximation(s), one or more Kramers-Kronig dispersion relations and/or one or more Plemelj dispersion relations, to convert measured intensity asymmetry information (typically measured for a limited number of wavelengths) in a position correction for mark asymmetry. More specifically, the method may comprise mathematically calculating the intensity asymmetry value into a phase offset value corresponding to mark asymmetry (e.g., calculating the phase offset from intensity asymmetry using physics principles). This may be implemented on an alignment sensor (but alternatively also on an overlay sensor, a focus sensor and/or a leveling sensor) having a functionality to measure the intensity of the positive diffraction order and of the negative diffraction order. As such, the intensity measurements in this context relate to the diffracted orders +1, −1 (and not SRI intensity signals SSI of FIG. 3). This dispersion model(s) and/or dispersion equation(s) and/or dispersion approximation(s) based approach results in a physics first principles based approach, the benefit of which is that it avoids (or at least partially) the need for a training to reference data obtained by a sensor other than the alignment sensor itself.

Asymmetry in an alignment mark results in a phase offset which is additional to the position information encoded in the phase data measured by the alignment sensor. The intensity asymmetry is resultant only from the mark asymmetry. Therefore, the method proposed herein may use a dispersion model per diffraction order (e.g., +1 and −1 diffraction order) to describe the measured intensity asymmetry (or related parameter such as amplitude asymmetry), but alternatively diffractions orders pairs might also be combined, e.g., summed or subtracted. By fitting the dispersion models to the measured intensity data (e.g., for a number of illumination conditions such as wavelengths/polarizations or combinations thereof), an estimate for a phase offset (per wavelength or common to all wavelengths) which is equivalent to the intensity/amplitude asymmetry can be determined. This phase offset can be used to determine a corresponding position offset or correction. Measurement of intensity asymmetry at different illumination conditions may be performed in parallel or sequentially.

Note that any mention of determining a phase offset value or phase offset can be read as determining a position correction as the terms are synonymous.

A dispersion model which is suitable for adaption to this application, has been described in another context in US patent publication US2019/0107781, which is incorporated herein by reference. This describes using hyperspectral illumination radiation (for example when measuring with 100 or more different illumination wavelength and polarization combinations) and a generic (for example first physics principles based) dispersion model to reduce the total number of degrees of freedom, so as to regularize the equivalent "phase retrieval loss/cost function". It is proposed to use such a dispersion model to determine a position correction for alignment mark asymmetry. While it is unlikely that such a large number of illumination combinations will be available with an alignment sensor (10 to 12 wavelengths are typical), the amount of variety required for estimating/computing the position correction is less than required for a full phase retrieval. This is because (for example) the wavelength-to-wavelength position variations can already be measured by a well calibrated wafer alignment sensor, and hence (for this example) only the (wavelength common) position offset needs to be estimated/computed.

Determining a generic dispersion model may comprise modeling the change in refractive index (or similar parameter) against wavelength/polarization (or propagation direction in the material) for each target using the measurement data from each wavelength and polarization combination. The model may then comprise a model of the target as a transmission function.

Figure 4:
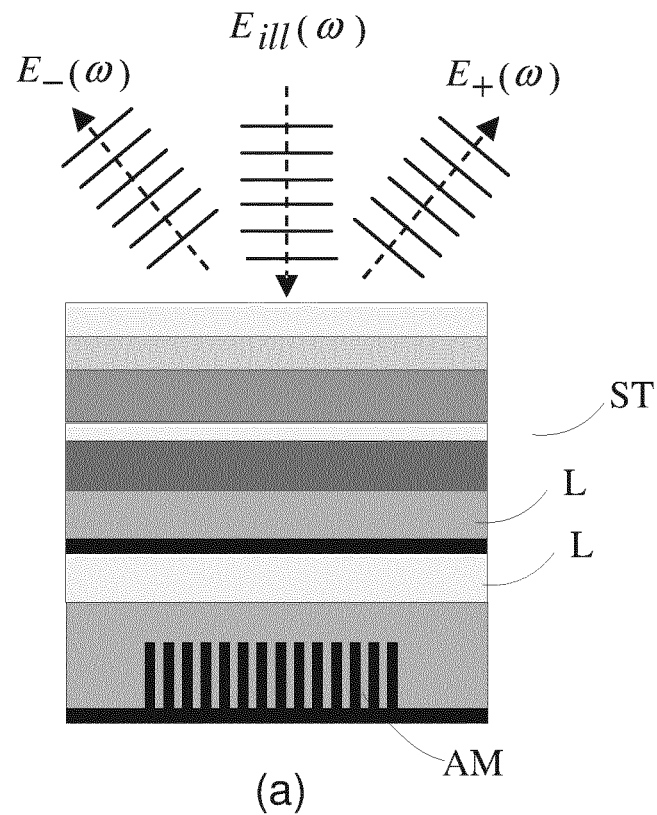
FIG. 4 conceptually illustrates an electrical dispersion model, consisting of an effective medium with length "d" and a wavelength dependent complex electric relative permittivity function $\varepsilon_r$, used in an embodiment of the invention.

FIG. 4 conceptually illustrates the proposal. FIG. 4(a) shows an example stack ST comprising many layers L, each having respective properties such as refractive indices and thicknesses, and an alignment mark AM beneath these layers L. The stack is measured using alignment illumination described by a (frequency ω dependent) electric field $E_{ill}(\omega)$, and the captured diffraction orders are respectively described by electric fields $E_-(\omega), E_+(\omega)$. These field variables are (typically) complex value variables, which comprise both amplitude and phase information on the electric (scalar) field. For an optional (full) vectorial electric field treatment, each (orthogonal) electric field component may be processed individually, in turn. In addition, these individual problems may optionally be coupled, so as to exploit commonalities (e.g. a common dispersion model parameter).

In FIG. 4(b), the wafer stack and grating are replaced by an effective medium EM (of thickness d) described in terms of $\exp(i \cdot \omega \sqrt{\varepsilon_0 \cdot \varepsilon_r \cdot \mu_0} \cdot d)$, where ω is the angular frequency, $\varepsilon_0$ is the permittivity constant, $\mu_0$ is the permeability constant and $\varepsilon_r$ is the complex effective dielectric permittivity dispersion function which is described by the dispersion model, where the imaginary part describes the absorption in the effective medium.

As has been described in US2019/0107781, the electric permittivity function $\varepsilon_r(\omega)$ may take the form:

$$\varepsilon_r(\omega) = 1 + \chi(\omega) \tag{1}$$

$$\chi(\omega) = c_{re} - i \cdot \sum_{m=0}^{M} \frac{a_m}{i \cdot \omega - b_m} - \frac{a_m^*}{i \cdot \omega - b_m^*} \tag{2}$$

$$b_m = -\varsigma_m \cdot \omega_m + \omega_m \cdot \sqrt{\varsigma_m^2 - 1} \tag{3}$$

where $c_{re}$ is the real offset constant, $a_m$ is the dipole complex amplitude, $\omega_m$ dipole natural eigenfrequency, $\zeta_m$ is the dipole sampling constant $(0<\zeta_m<1)$, $$\frac{1}{\zeta_m \cdot \omega_m}$$

is the dipole time constant and i is the imaginary unit $(=\sqrt{-1})$. Note that all poles occur as (conjugated) pole pairs (dipoles), where M denotes the total number of pole pairs.

As can be seen in FIG. 4:

$$E(\omega)=\exp(i\cdot\omega\sqrt{\varepsilon_0\cdot\varepsilon_r\mu_0}\cdot d)\cdot E_{ill}(\omega) \quad (4)$$

and therefore:

$$|E(\omega)| = \exp\left(-\omega\cdot\sqrt{\varepsilon_0\cdot\mu_0}\cdot\mathrm{Im}\left(\sqrt{\varepsilon_r}\right)\cdot d\right)\cdot|E_{ill}(\omega)| \quad (5)$$

$$\frac{|E(\omega)|}{|E_{ill}(\omega)|} = \exp\left(-\omega\cdot\sqrt{\varepsilon_0\cdot\mu_0}\cdot\mathrm{Im}\left(\sqrt{\varepsilon_r}\right)\cdot d\right) \quad (6)$$

$$\ln\left(\frac{|E(\omega)|}{|E_{ill}(\omega)|}\right) = -\omega\cdot\sqrt{\varepsilon_0\cdot\mu_0}\cdot\mathrm{Im}\left(\sqrt{\varepsilon_r}\right)\cdot d \quad (7)$$

There are two effective media which have respective complex effective dielectric permittivity dispersion functions $\varepsilon_{r+}$, $\varepsilon_{r-}$, and two effective media lengths $d_+$, $d_-$ (in which the speed of light that is omitted in these equations is included); one for the positive diffraction order $E_+(\omega)$ and one for the negative diffraction order $E_-(\omega)$. As such, + and − subscripts will be used throughout below for any diffraction order dependent parameters:

$$\ln\left(\frac{|E_+(\omega)|}{|E_{ill}(\omega)|}\right) - \ln\left(\frac{|E_-(\omega)|}{|E_{ill}(\omega)|}\right) = \quad (8)$$

$$-\omega\cdot\sqrt{\varepsilon_0\cdot\mu_0}\cdot\left(\mathrm{Im}\left(\sqrt{\varepsilon_{r+}}\right)\cdot d_+ - \mathrm{Im}\left(\sqrt{\varepsilon_{r-}}\right)\cdot d_-\right)$$

$$\ln|E_+(\omega)| - \ln|E_-(\omega)| = -\omega\cdot\sqrt{\varepsilon_0\cdot\mu_0}\cdot\left(\mathrm{Im}\left(\sqrt{\varepsilon_{r+}}\right)\cdot d_+ - \mathrm{Im}\left(\sqrt{\varepsilon_{r-}}\right)\cdot d_-\right) \quad (9)$$

$$\left\{ \quad (10)\right.$$

$$\ln(G) = \ln(|G|) + i\cdot\arg(G) \text{ where } G\in\mathbb{C}$$

$$\ln|E_+(\omega)| - \ln|E_-(\omega)| = -\omega\cdot\sqrt{\varepsilon_0\cdot\mu_0}\cdot\left(\mathrm{Im}\left(\sqrt{\varepsilon_{r+}}\right)\cdot d_+ - \mathrm{Im}\left(\sqrt{\varepsilon_{r-}}\right)\cdot d_-\right)$$

Hence:

$$\arg(E_+(\omega)) - \arg(E_-(\omega)) = \quad (11)$$

$$-\omega\cdot\sqrt{\varepsilon_0\cdot\mu_0}\cdot\left(\mathrm{Re}\left(\sqrt{\varepsilon_{r+}}\right)\cdot d_+ - \mathrm{Re}\left(\sqrt{\varepsilon_{r-}}\right)\cdot d_-\right)$$

$$\varepsilon_{r+}(\omega) = 1 + c_{re+} - i\cdot\sum_{m+=1}^{M}\frac{a_{m+}}{i\cdot\omega-b_{m+}} - \frac{a^*_{m+}}{i\cdot\omega-b^*_{m+}} \quad (12a)$$

$$\varepsilon_{r-}(\omega) = 1 + c_{re-} - i\cdot\sum_{m-=1}^{M}\frac{a_{m-}}{i\cdot\omega-b_{m-}} - \frac{a^*_{m-}}{i\cdot\omega-b^*_{m-}} \quad (12b)$$

where the model complexity in Equations 12a and 12b have been regularized/truncated to a finite "M", enabling the estimation/computation to work with a limited number of illumination wavelengths.

Therefore a method as disclosed herein may comprise the steps of:
1) obtaining intensity asymmetry data from one or more measurements of the target (e.g., for multiple wavelengths).
2) Fitting the dispersion model(s) and/or dispersion equation(s) and/or dispersion approximation(s), e.g. the dispersion models of Equations 12a and 12b, to the measured intensity asymmetry in accordance with Equation (9). As can be seen in Equation 9, the intensity asymmetry may first be converted to an amplitude asymmetry (e.g., difference in amplitudes of the electric field $E_+(\omega)$, $E_-(\omega)$) by means of a root operation.
3) computing, using the fitted dispersion model, an equivalent phase offset $\Delta\varphi(\omega)$ for the intensity asymmetry and therefore a position correction $\Delta x(\omega)$:

$$\Delta x(\omega) = \frac{P}{4\pi n}\cdot\Delta\varphi(\omega) \quad (13)$$

Where: $\Delta\varphi(\omega) =$ $$\arg(E_+(\omega)) - \arg(E_-(\omega)) = -\omega\cdot\sqrt{\varepsilon_0\cdot\mu_0}\cdot\left(\mathrm{Im}\left(\sqrt{\varepsilon_{r+}}\right)\cdot d_+ - \mathrm{Im}\left(\sqrt{\varepsilon_{r-}}\right)\cdot d_-\right)$$

Where P is the mark pitch, $n\in\{1,2,3,\ldots\}$ is the diffraction order, $c_{re}$ is the real offset constant, $a_m$ is the dipole complex amplitude, $\omega_m$ dipole natural eigenfrequency, $\zeta_m$ is the dipole damping constant $(0<\zeta_m<1)$, and $b_m$ is as defined by Equation (3). Note that (when using the dispersion models of Equations 12a and 12b) all poles occur as (conjugated) pole pairs (dipoles), where M denotes the total number of pole pairs. Note that one of the two dispersion models $\varepsilon_{r+}(\omega)$ and $\varepsilon_{r-}(\omega)$ for the positive respectively negative diffraction order(s), may be kept constant and/or set to zero.

It should be noted that the real offset constant $c_{re+}$, $c_{re-}$ is an unobservable parameter in the model. However, it is known that when the (diffraction order) amplitude asymmetry is zero for all wavelengths, the position correction will be zero. Hence the parameters $c_{re+}$, $c_-$ will be equal. Their common/equal value (which is constant over time) is typically larger than zero, and this value may be best 'fitted' to the measured data obtained from the measurements of all available wavelengths.

The approach as outlined above may be applied to one specific detected (analyzed) polarization state. So as an example, it can be applied to the linear-X and/or the linear-Y polarization resolved detection channels of the alignment sensor. Note that while the two orthogonal polarization components of the detected electric field are treated independently here, there may also be a benefit in exploiting the relations between them. This could, for example, be done by coupling unknown parameters of the dispersion models, based on known physics grounds and/or experiments, where it is learnt or known that they are coupled. The unknown interrelated parameters may be, for example, coupled into a common dispersion model parameter.

Advantages of the proposed method described above is that there is no (or less) need for training to a reference sensor, and problems with zeroes in the 'transfer function' may be avoided. With respect to the latter point, reference may be made to (for example) paragraph III from the article "Kramers-Kronig, Bode, and the meaning of zero", John Bechhoefer, American Journal of Physics 79, 1053 30 Jun. 2011 which is hereby incorporated by reference.

While the above described methods are disclosed in terms of alignment/position metrology, they may also be used in other metrology application. For example, the concepts herein may be applicable to overlay metrology; e.g., to correct the resulting measured overlay for other (non-overlay or bias) target asymmetry (e.g., bottom grating asymmetry).

It is known in scatterometry based metrology (e.g., for measuring overlay) to determine a measurement recipe (in particular a particular illumination condition such as a wavelength/polarization combination) using a so-called swing curve. The swing curve is the dependence of overlay sensitivity K on wavelength $\lambda$ (or more generally illumination condition) using typical scatterometry techniques. The swing curve shows that there are some wavelengths for which the measurement is overlay insensitive, with the sensitivity being highly dependent on illumination condition and stack. Such an approach, for example. is described in "A study of swing-curve physics in diffraction-based overlay"; Kaustuve Bhattacharyya et al; Proc. SPIE 9778, Metrology, Inspection, and Process Control for Microlithography XXX, 977811; which is hereby incorporated by reference.

Figure 5:
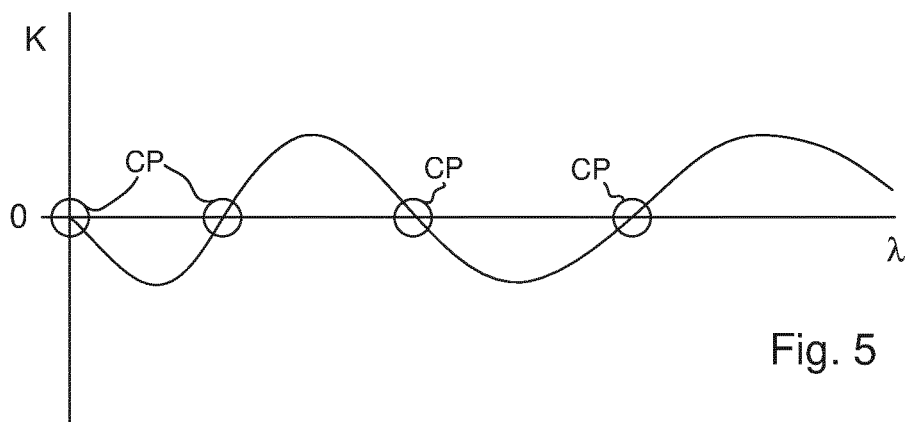
FIG. 5 comprises a swing curve determined according to known techniques for selecting overlay measurement recipes.

FIG. 5 is an exemplary swing curve, comprising a plot of overlay sensitivity K against wavelength $\lambda$, which illustrates this issue. As can be seen, there are a number of crossing points CP. These crossing points CP correspond to wavelengths for which the overlay sensitivity K, more specifically the intensity based overlay sensitivity, is zero, and therefore the diffraction based overlay method is insensitive to overlay using these wavelengths. Because the swing curve varies for different stacks, simply ensuring that the illuminating radiation used for measurement avoids these wavelengths is not trivial.

In wafer alignment, alignment sensors are being developed with an increasing number of wavelength/polarization combinations, and as such a similar framework for determining which illumination recipes should be used is desirable. Bluntly measuring a lot of wafers with the alignment sensor is not feasible since this takes a lot of time, which is particularly valuable on a scanner (as opposed to a separate metrology device). As such, it is proposed to select illumination conditions/recipes for an alignment sensor based on measurements performed on a separate metrology device (e.g., a scatterometer typically used for overlay monitoring). Such a method requires translating the metrology device measured signals to an alignment error or alignment position deviation (APD). Such a method connects the intensity values measured in a scatterometer based metrology device or similar to phase measured in alignment; a multi-wavelength (MWL) intensity measurement can then be to connect an expected alignment position offset and means to select stable illumination conditions/colors by looking at the gradient in APD as a function of wavelength.

In a recent paper, "A fast Fourier transform implementation of the Kramers-Kronig relations: Application to anomalous and left handed propagation" Lucas et al AIP Advances 2, 032144 (2012) (incorporated herein by reference), the Kramers-Kronig relations have been derived from simple causality considerations. Taking this teaching and applying it to complex fields coming from an alignment mark, a phase offset $\Delta\varphi$ and therefore position error (APD) $\Delta x$ of an alignment mark can be expressed solely in terms of the measured intensities:

$$\Delta\varphi = \frac{1}{2}\left(\text{Im}\left(H_T\left(\log(E_{+1}E_{+1}^*) - \log(E_{-1}E_{-1}^*)\right)\right)\right) \quad (14)$$

$$\Delta x = \frac{P}{8\pi n}\left(\text{Im}\left(H_T\left(\log(I_{+1}) - \log(I_{-1})\right)\right)\right) \quad (15)$$

where $H_T$ is the Hilbert transform: see sections II.A and II.B from the aforementioned Lucas article. Note the Im( )operator is not essential, it is added to suppress numerical noise.

This formula opens the way to compute an expected alignment error (APD) based on intensity asymmetries measured on that specific alignment mark for a number of different illumination conditions using a metrology tool other than the alignment sensor (e.g., a scatterometery based tool), and selecting a preferred illumination condition based on a plot of APD vs illumination condition (alignment swing curve); e.g., an illumination condition with the low APD and small gradient (low error within a stable region).

Figure 6:
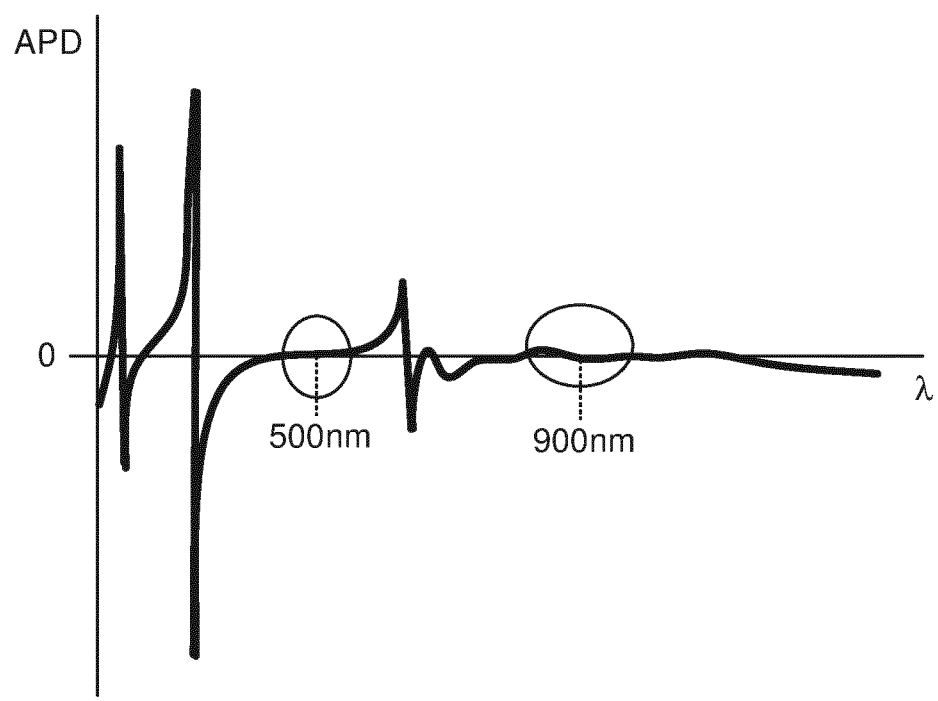
FIG. 6 comprises an alignment swing curve determined according to an embodiment of the invention.

FIG. 6 illustrates an exemplary alignment swing curve of APD against wavelength $\lambda$ (or more generally illumination condition) such as can be created based on Equation (15) and the dense intensity measurements performed using a dedicated metrology tool. From the alignment swing curve, stable wavelengths (e.g. the circled wavelength regions—in the specific example here around 500 nm and/or around 900 nm) can be selected, e.g., by looking at the gradient of the APD as a function of wavelength. The selected wavelengths can be fed to an OCW algorithm, or alternatively a single best color may be chosen. Alternatively, the knowledge of the APD gradient can also be used in a color weighting algorithm to derive a color combination which is (also) insensitive (or less sensitive) to shifts of the swing curve caused by stack variations.

In a refinement of this concept, instead of using one target (and illumination polarization combination), it is proposed to apply a dispersion relationship algorithm such as a Kramers-Kronig algorithm to multiple targets (and/or illumination polarization combinations). When these targets are located closely together, they all share the same (local) Wafer Deformation. This can be exploited algorithmically, leading to improved accuracy and/or precision and/or robustness.

Averaging over multiple targets (and/or polarization combinations) reduce the error inherent in the Kramers-Kronig algorithm due to the limited wavelength range and wavelength sampling density used in measurement. Alternatively, rather than averaging, other techniques may be used. For example, the signal to noise ratio of the resulting position may be optimized, for example, by means of optimal weighing of the measurements from the different targets.

A further embodiment will now be described which comprises determining a monitoring metric or key performance indicator (KPI) from the phase offset as calculated from the measured intensity asymmetry value. The availability of these pupil intensity measurements, allows for a sensor measurement data consistency KPI to be computed, via the Kramers-Kronig relations.

Using the Kramers-Kronig relations, measured intensity asymmetry information can be transformed into phase/position information and vice versa. This make it possible to 1), compute/construct a data consistency KPI between the measured intensity asymmetry information and the measured phase/position information, and 2), compute one or more process variation KPI's.

Referring back to FIG. 4(a), but now considering amplitudes $A_-(\omega)$, $A_+(\omega)$:

$$A_+(\omega)=|A_+(\omega)|\cdot e^{i\cdot\varphi_+(\omega)}$$

$$A_-(\omega)=|A_-(\omega)|e^{i\cdot\varphi_-(\omega)}$$

or in shorthand:

$$A_\pm(\omega)=|A_\pm(\omega)|e^{i\cdot\varphi_\pm(\omega)} \quad (16)$$

The phases $\varphi_+$, $\varphi_-$ may be defined such that the reference moves with the grating and not the sensor or vice versa. As the Wafer stage movement does not influence the measured diffraction order intensities, the former may be preferred.

It can be shown that the above function for $A_\pm(\omega)$ is an analytical function and the Plemelj dispersion relations apply; i.e.:

$$\begin{cases} \ln(|A_\pm(\omega)|) = \frac{1}{\pi} \cdot PV \int_{-\infty}^{+\infty} \frac{\varphi_\pm(\omega)}{\omega' - \omega} d\omega' \\ \varphi_\pm(\omega) = -\frac{1}{\pi} \cdot PV \int_{-\infty}^{+\infty} \frac{\ln(|A_\pm(\omega)|)}{\omega' - \omega} d\omega' \end{cases} \quad (17)$$

where PV denotes computing the Cauchy principal value.

Using the refractive index form of the Plemelj dispersion relations, the following Kramers-Kronig relations can be derived for complex refractive index $n(\omega)$ in non-conducting isotropic media:

$$\text{Re}(n(\omega)) - 1 = \frac{2}{\pi} \cdot PV \int_0^{+\infty} \frac{\omega' \cdot \text{Im}(n(\omega'))}{\omega'^2 - \omega^2} d\omega' \quad (18)$$

$$\text{Im}(n(\omega)) = -\frac{2}{\pi} \cdot PV \int_0^{+\infty} \frac{\omega' \cdot (\text{Re}(n(\omega')) - 1)}{\omega'^2 - \omega^2} d\omega' \quad (19)$$

These Kramers-Kronig relations can be applied to $A_\pm(\omega)$:

$$\begin{cases} \ln(|A_\pm(\omega)|) = \frac{2}{\pi} \cdot PV \int_0^{+\infty} \frac{\omega' \cdot \varphi_\pm(\omega')}{\omega'^2 - \omega^2} d\omega' \\ \varphi_\pm(\omega) = -\frac{2}{\pi} \cdot PV \int_0^{+\infty} \frac{\omega \cdot \ln(|A_\pm(\omega')|)}{\omega'^2 - \omega^2} d\omega' \end{cases} \quad (20)$$

Using $\varphi_{MD}(\omega) = \varphi_+(\omega) - \varphi_-(\omega)$, where denotes the phase resultant from mark deformation $\varphi_{MD}(\omega)$, as the phase reference and exploiting linearity of the Kramers-Kronig relations yields the grating diffraction order pair of Kramers-Kronig relations:

$$\begin{cases} \alpha(\omega) = \frac{2}{\pi} \cdot PV \int_0^{+\infty} \frac{\omega' \cdot \varphi_{MD}(\omega')}{\omega'^2 - \omega^2} d\omega' \\ \varphi_{MD}(\omega) = -\frac{2}{\pi} \cdot PV \int_0^{+\infty} \frac{\omega \cdot \alpha(\omega')}{\omega'^2 - \omega^2} d\omega' \end{cases} \quad (21)$$

where:

$$\alpha(\omega) = \ln(|A_+(\omega)|) - \ln(|A_-(\omega)|) = \ln\left(\frac{|A_+(\omega)|}{|A_-(\omega)|}\right)$$

From this, the following relations may be derived:

$$\begin{cases} \varphi_{MD}(\omega) = -\frac{2}{\pi} \cdot \int_0^{+\infty} \frac{\omega \cdot (\alpha(\omega') - \alpha(\omega))}{\omega'^2 - \omega^2} d\omega' \\ \alpha(\omega) = \frac{2}{\pi} \cdot \omega^2 \int_0^{+\infty} \frac{\frac{\varphi_{MD}(\omega')}{\omega'} - \frac{\varphi_{MD}(\omega)}{\omega}}{\omega'^2 - \omega^2} d\omega' \end{cases} \quad (22)$$

It is proposed that these relations are used for the new KPI's. FIG. 7(a) shows a plot of position p as determined from the equation for $\varphi_{MD}(\omega)$ above against wavelength $\lambda$ (solid line) and an equivalent plot of actual values (here determined via RCWA simulation) (dotted line). FIG. 7(b) shows a plot of $1\,n(|A(\omega)|)$ determined from the equation for $\alpha(\omega)$ against wavelength (solid line) and an equivalent plot of actual or RCWA simulated values (dotted line). It can be seen in each plot, the swing curve for the Kramers-Kronig calculated line has a similar shape to that of its RCWA counterpart; however it has a y-axis (measured position or log amplitude) offset.

This offset results from the limited wavelength range used in the alignment measurement (e.g., typically 12 wavelengths). Kramers-Kronig requires $0 \leq \lambda \leq \infty$ as input, and the limited wavelength range (and sampling density) which is actually available has the greatest impact on the DC term, i.e., the Wafer Deformation (offset). It is unlikely to be possible to correctly compute this offset using only the transformed intensity asymmetry information or phase/position information for a limited number of wavelengths $\lambda$.

Such a KPI may be used as a sensor consistency/drift KPI and/or a process drift/variation KPI via the consistency between the measured phase and measured intensity asymmetry. Such a method may comprise using an alignment sensor with intensity channels to measure both intensity asymmetry and phase as a function of wavelength (e.g., to plot a measured swing curve for both). A comparison metric may be used to compare the shapes of each swing curve with the equivalent swing curve as calculated using the corresponding Kramers-Kronig equation as recited above based on the measured data. For example, the measured position swing curve can be compared to a calculated position swing curve as calculated from the measured intensity channels; and/or the measured (1 n) asymmetry swing curve can be compared to a calculated asymmetry swing curve as calculated from the measured position.

Should this comparison metric indicate a large difference during process setup, this may be a warning that this particular stack/mark-type/sensor combination should be avoided (e.g. by selecting a different mark, potentially from a different layer) or that the related sensor has a problem.

As with the previous embodiment, this method can be based on combined measurements from multiple targets (and/or polarization combinations), e.g., located closely together, so as to reduce the effect of the limited wavelength range and wavelength sampling density. Where the multiple target sets are at different positions on the wafer, where the mark deformation is typically also different, this combination of measurements can also be used to calculate the mark deformation contribution in the APD.

While specific embodiments of the invention have been described above, it will be appreciated that the invention may be practiced otherwise than as described.

While the above concepts are described in terms of wafer alignment, they are applicable to other metrology aspects such as, for example: 1) overlay metrology, 2) focus metrology and 3) waver levelling.

The above description describes starting with intensity measurements, and translating these into a phase corresponding to the asymmetry and then into a correction. However, there are two dispersion relations, one translating intensity asymmetry to phase, and one doing the opposite. This disclosure covers both options; it is possible to use either one, or both. This means that the other calculation directions also exist and can be used.

Embodiments are Provided According to the Following Clauses:

1. A metrology method relating to measurement of a structure on a substrate, the structure being subject to one or more asymmetric deviation, the method comprising: obtaining at least one intensity asymmetry value relating to the asymmetric deviation, wherein the at least one intensity asymmetry value comprises a metric related to a difference or imbalance between the respective intensities or amplitudes of at least two diffraction orders of radiation diffracted by the structure;
  determining at least one phase offset value corresponding to the one or more asymmetric deviation based on the at least one intensity asymmetry value; and
  determining one or more measurement correction for the one or more asymmetric deviation from the one or more phase offset.

2. The method of clause 1, wherein the determining comprises calculating at least one phase offset value corresponding to the one or more asymmetric deviation from the at least one intensity asymmetry value.

3. The method of clause 1 or 2, wherein the at least one intensity asymmetry value further relates to symmetric deviation of the structure; and the determined at least one phase offset value also corresponds to the symmetric deviation, such that the determined measurement correction also corrects for the symmetric deviation.

4. The method of clause 1 or 2, wherein the at least two diffraction orders comprise at least one pair of complementary diffraction orders.

5. The method of clause 1 or 2, wherein comprising obtaining an intensity asymmetry value relating to the structure for each of a plurality of different illumination settings.

6. The method of clause 5, wherein different illumination settings may comprise different wavelengths, polarizations or combinations thereof.

7. The method of clause 5, further comprising determining a phase offset value for each illumination setting.

8. The method of clause 5, further comprising determining phase offset variation data between phase measurements relating to each of the different illumination settings; and
  using the phase offset variation data in the calculating step to determine the phase offset value as a common phase offset value for all the illumination settings.

9. The method of clause 5, where the calculating step comprises:
  fitting at least one dispersion model and/or dispersion relation and/or dispersion approximation to the intensity asymmetry measurement to obtain a fitted dispersion model and/or dispersion relation and/or dispersion approximation, the dispersion model and/or dispersion relation and/or dispersion approximation comprising a model of the structure as a transmission function or an approximation thereof; and
  determining the phase offset value from the fitted dispersion model and/or dispersion relation and/or dispersion approximation.

10. The method of clause 5, comprising:
  fitting a dispersion model and/or dispersion relation and/or dispersion approximation to the phase offset measurement to obtain a fitted dispersion model and/or dispersion relation and/or dispersion approximation, the dispersion model and/or dispersion relation and/or dispersion approximation comprising a model of the structure as a transmission function or an approximation thereof; and
  determining an intensity asymmetry measurement value from the fitted dispersion model and/or dispersion relation and/or dispersion approximation.

11. The method of clause 9, wherein the fitting step comprises fitting a separate dispersion model for each of two complementary diffraction orders.

12. The method of clause 11, wherein a difference for the value for a real offset constant for each of the dispersion models is assumed to be in the region of zero.

13. The method of clause 9, wherein the dispersion model and/or dispersion relation and/or dispersion approximation models variation of one or more light-matter interaction parameters with illumination condition, for the structure.

14. The method of clause 13, wherein the one or more light-matter interaction parameter comprises one or more of: refractive index, electric permittivity, electric susceptibility and any one or more parameters related thereto.

15. The method of clause 13, comprising determining the at least one dispersion model and/or dispersion relation and/or dispersion approximation by measuring the variation of the one or more light-matter interaction parameters with varied illumination conditions and determining the at least one dispersion model and/or dispersion relation and/or dispersion approximation from the resultant measurement values and corresponding illumination conditions.

16. The method of clause 9, wherein a relative magnetic permeability for the at least one dispersion model is assumed or known to be non-unity.

17. The method of clause 1 or 2, wherein the metrology method comprises a method of determining a position measurement relating to a position of a structure on a substrate, and the measurement correction comprises one or more position corrections.

18. The method of clause 17, wherein the structure comprises an alignment mark with a stack of layers formed thereon.

19. The method of clause 18, wherein the position correction corrects at least partly for asymmetry in the alignment mark.

20. The method of clause 1 or 2, comprising measuring the structure to obtain the intensity asymmetry value.

21. The method of clause 20, wherein the step of measuring the structure is performed using an alignment sensor; the method further comprising measuring position data for correcting using the position correction.

22. The method of clause 21, wherein the intensity asymmetry values and position data are measured simultaneously from the step of measuring the structure.

23. The method of clause 17, comprising:
  performing at least the steps of obtaining an intensity asymmetry value and calculating the intensity asymmetry value to a phase offset value for each of a plurality of different illumination conditions; and
  evaluating the variation of phase offset value and/or position correction with illumination condition.

24. The method of clause 23, wherein the illumination condition relates at least to wavelength of measurement radiation.

25. The method of clause 23, further comprising selecting one or more illumination conditions for a subsequent position measurement of the structure based on the evaluation.

26. The method of clause 25, wherein the evaluation comprises selecting one or more illumination conditions for which the evaluation shows the phase offset value and/or position correction to be below a threshold magnitude and/or a gradient of the variation to be below a threshold gradient magnitude.

27. The method of clause 25, wherein the variation of the phase offset value and/or position correction with illumination condition is used in to determine a wavelength combination which is insensitive or least sensitive to the variation.

28. The method of clause 25, wherein the subsequent position measurement is performed using an alignment sensor and the intensity asymmetry values are obtained using a metrology tool other than the alignment sensor.

29. The method of clause 28, wherein the intensity asymmetry values are obtained using a scatterometery based metrology tool.

30. The method of clause 25, comprising performing the subsequent position measurement using the selected one or more illumination conditions.

31. The method of clause 30, comprising performing measurements on the structure under a plurality of different illumination conditions to obtain each intensity asymmetry value.

32. The method of clause 23, wherein the evaluation step comprises comparing:
   the variation with illumination condition of the phase offset value and/or position correction as calculated; and
   a variation with illumination condition of a measured phase offset value and/or position correction, so as to determine a monitoring metric.

33. The method of clause 32, wherein the intensity asymmetry values and measured phase offset values and/or position corrections are both measured using an alignment sensor, and the monitoring metric monitors consistency between measurement channels for measuring the intensity asymmetry values and measurement channels for measuring the phase offset value and/or position correction.

34. The method of clause 32 or 33, wherein the evaluation step further comprises comparing:
   a variation with illumination condition of intensity asymmetry values calculated from measured phase offset values and/or position correction values; and
   a variation with illumination condition of measured intensity asymmetry values, so as to determine the monitoring metric.

35. The method of clause 32, wherein the comparing comprises comparing the shape of the variations with illumination condition.

36. The method of clause 23, wherein the measured intensity asymmetry values and/or the measured phase offset values and/or position corrections comprise values averaged or combined over a plurality of targets.

37. The method of clause 36, comprising using the measured intensity asymmetry values and/or the measured phase offset values and/or position corrections comprise values averaged or combined over a plurality of targets to reduce an error inherent in the dispersion model and/or dispersion relation and/or dispersion approximation models due to a limited wavelength range and wavelength sampling density used in measurement.

38. The method of clause 36, comprising determining a weighing of each of the measurements from the plurality of targets to improve the signal to noise ratio of the determined position.

39. The method of clause 1 or 2, wherein the metrology method comprises a method of determining overlay relating to a relative position of two layers on a substrate, and the measurement correction comprises a correction for asymmetry in the structure not related to the relative position of the two layers.

40. The method of clause 1 or 2, wherein the metrology method comprises a method of determining a focus setting of a lithographic tool during formation of the structure.

41. The method of clause 1 or 2, wherein the metrology method comprises a substrate leveling method to determine the flatness of a substrate.

42. A computer program comprising program instructions operable to perform the method of any of clauses 1 to 41, when run on a suitable apparatus.

43. A non-transient computer program carrier comprising the computer program of clause 42.

44. A processing system comprising a processor and a storage device comprising the computer program of clause 43.

45. An alignment sensor operable to perform the method of any of clauses 1 to 38.

46. A lithographic apparatus comprising:
   a patterning device support for supporting a patterning device;
   a substrate support for supporting a substrate; and
   the alignment sensor of clause 45.

47. A lithographic cell being operable to perform the method of clause 29, and comprising:
   a metrology device operable to perform the measurements on the structure under a plurality of different illumination conditions; and
   a lithographic apparatus comprising a patterning device support for supporting a patterning device; a substrate support for supporting a substrate; and an alignment sensor for measuring a structure on the substrate in an alignment process, the alignment sensor being operable to perform the position measurement.

48. A metrology device operable to perform the method of clause 41.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A metrology method relating to measurement of a structure on a substrate, the structure being subject to one or more asymmetric deviations, the method comprising:
   obtaining at least one intensity asymmetry value relating to the one or more asymmetric deviations, wherein the at least one intensity asymmetry value comprises a metric related to a difference or imbalance between the respective intensities or amplitudes of at least two diffraction orders of radiation diffracted by the structure;

determining at least one phase offset value corresponding to the one or more asymmetric deviations based on the at least one intensity asymmetry value; and determining one or more measurement corrections for the one or more asymmetric deviation from the at least one phase offset value.

2. The method as claimed in claim 1, wherein the determining at least one phase offset value comprises calculating the at least one phase offset value corresponding to the one or more asymmetric deviations from the at least one intensity asymmetry value.

3. The method as claimed in claim 1, wherein the at least one intensity asymmetry value further relates to symmetric deviation of the structure; and the determined at least one phase offset value also corresponds to the symmetric deviation, such that the determined one or more measurement corrections also correct for the symmetric deviation.

4. The method as claimed in claim 1, wherein the at least two diffraction orders comprise at least one pair of complementary diffraction orders.

5. The method as claimed in claim 1, wherein the obtaining comprises obtaining an intensity asymmetry value relating to the structure for each of a plurality of different illumination settings.

6. The method as claimed in claim 5, further comprising:
determining phase offset variation data between phase measurements relating to each of the different illumination settings; and
using said phase offset variation data in the determining to determine the at least one phase offset value as a common phase offset value for all the illumination settings.

7. The method as claimed in claim 5, where the determining comprises:
fitting at least one dispersion model and/or dispersion relation and/or dispersion approximation to the at least one intensity asymmetry value to obtain a fitted dispersion model and/or dispersion relation and/or dispersion approximation, the dispersion model and/or dispersion relation and/or dispersion approximation comprising a model of the structure as a transmission function or an approximation thereof; and
determining the at least one phase offset value from the fitted dispersion model and/or dispersion relation and/or dispersion approximation.

8. The method as claimed in claim 7, wherein the fitting comprises fitting a separate dispersion model for each of two complementary diffraction orders.

9. The method as claimed in claim 7, wherein the dispersion model and/or dispersion relation and/or dispersion approximation models variation of one or more light-matter interaction parameters with illumination condition, for the structure.

10. The method as claimed in claim 1, wherein the measurement of the structure comprises position measurement relating to a position of a structure on a substrate, and the one or more measurement corrections comprises one or more position corrections.

11. The method as claimed in claim 10, comprising:
performing at least the obtaining the at least one intensity asymmetry value and determining the at least one phase offset value for each of a plurality of different illumination conditions; and evaluating variation of phase offset value and/or measurement correction with illumination condition.

12. The method as claimed in claim 11, further comprising selecting one or more illumination conditions for a subsequent position measurement of the structure based on the evaluation.

13. The method as claimed in claim 12, wherein the subsequent position measurement is performed using an alignment sensor and the at least one intensity asymmetry value is obtained using a metrology device other than the alignment sensor.

14. A lithographic cell being configured to perform the method of claim 13, and comprising:
a metrology device configured to perform the measurements on the structure under a plurality of different illumination conditions; and
a lithographic apparatus comprising a patterning device support configured to support a patterning device, a substrate support configured to support a substrate, and an alignment sensor configured to measure a structure on the substrate in an alignment process, the alignment sensor being configured to perform the position measurement.

15. The method as claimed in claim 12, further comprising performing the subsequent position measurement using the selected one or more illumination conditions.

16. The method as claimed in claim 11, wherein the evaluating comprises comparing:
a variation with illumination condition of the phase offset value and/or measurement correction as determined; and
a variation with illumination condition of a measured phase offset value and/or measurement correction,
so as to determine a monitoring metric.

17. The method as claimed in claim 1, comprising measuring the structure to obtain the intensity asymmetry value.

18. The method as claimed in claim 17, wherein the measuring the structure is performed using an alignment sensor; and further comprising measuring position data for correcting using the one or more measurement corrections.

19. The method as claimed in claim 18, wherein the at least one intensity asymmetry value and position data are measured simultaneously from the measuring the structure.

20. The method as claimed in claim 1, wherein the measurement of the structure comprises determining overlay relating to a relative position of two layers on a substrate, and the one or more measurement corrections comprises a correction for asymmetry in the structure not related to the relative position of the two layers.

21. The method as claimed in claim 1, wherein the measurement of the structure comprises determining a focus setting of a lithographic tool during formation of the structure.

22. The method as claimed in claim 1, wherein the measurement of the structure comprises a substrate leveling method to determine the flatness of a substrate.

23. A non-transient computer program carrier comprising a computer program comprising program instructions, when run on a suitable apparatus configured to cause performance of at least:
obtain at least one intensity asymmetry value relating to one or more asymmetric deviations of a measurement structure on a substrate, wherein the at least one intensity asymmetry value comprises a metric related to a difference or imbalance between the respective intensities or amplitudes of at least two diffraction orders of radiation diffracted by the structure;

determine at least one phase offset value corresponding to the one or more asymmetric deviations based on the at least one intensity asymmetry value; and determine one or more measurement corrections for the one or more asymmetric deviation from the at least one phase offset value.

24. An alignment sensor or metrology device comprising the non-transient computer program carrier, configured to perform the method of claim 23.

25. A lithographic apparatus comprising:
a patterning device support configured to support a patterning device;
a substrate support configured to support a substrate; and
the alignment sensor of claim 24.

* * * * *